United States Patent
Hoffman et al.

(10) Patent No.: US 10,012,248 B2
(45) Date of Patent: Jul. 3, 2018

(54) ANNULAR BAFFLE

(71) Applicant: Applied Materials, Inc., Santa Clara, CA (US)

(72) Inventors: Daniel J. Hoffman, Fort Collins, CO (US); Kallol Bera, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/228,660

(22) Filed: Aug. 4, 2016

(65) Prior Publication Data
US 2016/0341227 A1  Nov. 24, 2016

Related U.S. Application Data

(60) Continuation of application No. 14/162,497, filed on Jan. 23, 2014, now abandoned, which is a division of (Continued)

(51) Int. Cl.
*C23C 16/458* (2006.01)
*H01J 37/32* (2006.01)
(Continued)

(52) U.S. Cl.
CPC ............ *F15D 1/0005* (2013.01); *C23C 14/22* (2013.01); *C23C 16/44* (2013.01); *C23C 16/4412* (2013.01); *C23C 16/4585* (2013.01); *C23C 16/4586* (2013.01); *H01J 37/32009* (2013.01); *H01J 37/32623* (2013.01); *H01J 37/32633* (2013.01); *H01L 21/67069* (2013.01); *H01L 21/67109* (2013.01); *H01L 21/6831* (2013.01); *H01J 2237/334* (2013.01)

(58) Field of Classification Search
None
See application file for complete search history.

(56) References Cited

U.S. PATENT DOCUMENTS 5,273,588 A  12/1993  Foster et al.
5,891,350 A   4/1999  Shan et al.
(Continued)

FOREIGN PATENT DOCUMENTS

CN    1779906 A    5/2006
JP   59132623 A    7/1984
(Continued)

OTHER PUBLICATIONS

Office Action for Japanese Application No. 2016-219491 dated Aug. 29, 2017.
(Continued)

*Primary Examiner* — Binu Thomas
(74) *Attorney, Agent, or Firm* — Patterson + Sheridan, LLP

(57) ABSTRACT

A baffle assembly for an etching apparatus is disclosed. The baffle assembly comprises a ring and a lower baffle portion having a curved wall extending between a flange portion and a lower frame portion. A heating assembly may be present within the lower frame portion to control the temperature of the baffle. The baffle assembly may help confine the plasma within the processing space in the chamber. The ring may comprise silicon carbide and the lower baffle portion may comprise aluminum.

17 Claims, 5 Drawing Sheets

Related U.S. Application Data application No. 12/109,332, filed on Apr. 24, 2008, now Pat. No. 8,647,438.

(60) Provisional application No. 60/914,583, filed on Apr. 27, 2007.

(51) Int. Cl.

| | |
|---|---|
| *F15D 1/00* | (2006.01) |
| *C23C 16/44* | (2006.01) |
| *H01L 21/67* | (2006.01) |
| *C23C 14/22* | (2006.01) |
| *H01L 21/683* | (2006.01) |

(56) References Cited

U.S. PATENT DOCUMENTS

| | | | |
|---|---|---|---|
| 6,123,773 | A | 9/2000 | Sajoto et al. |
| 6,133,152 | A | 10/2000 | Bierman et al. |
| 6,159,299 | A * | 12/2000 | Koai .............. C23C 16/45521 118/715 |
| 6,178,919 | B1 | 1/2001 | Li et al. |
| 6,221,221 | B1 | 4/2001 | Al-Shaikh et al. |
| 6,394,026 | B1 | 5/2002 | Wicker et al. |
| 6,974,523 | B2 | 12/2005 | Benzing et al. |
| 7,024,105 | B2 | 4/2006 | Fodor et al. |
| 7,585,384 | B2 | 9/2009 | Bera et al. |
| 7,618,516 | B2 | 11/2009 | Bera et al. |
| 7,674,353 | B2 | 3/2010 | Bera et al. |
| 7,754,997 | B2 | 7/2010 | Bera et al. |
| 7,780,866 | B2 | 8/2010 | Miller et al. |
| 7,972,467 | B2 | 7/2011 | Bera et al. |
| 7,988,815 | B2 | 8/2011 | Rauf et al. |
| 8,075,728 | B2 | 12/2011 | Balakrishna et al. |
| 8,360,003 | B2 | 1/2013 | Nguyen et al. |
| 2002/0179246 | A1 | 12/2002 | Garabedian et al. |
| 2006/0090703 | A1* | 5/2006 | Kaise ................. H01L 21/6831 118/719 |
| 2006/0172542 | A1 | 8/2006 | Bera et al. |
| 2006/0191639 | A1 | 8/2006 | Tanaka et al. |
| 2008/0066682 | A1 | 3/2008 | Yamashita |
| 2012/0305185 | A1 | 12/2012 | Singh et al. |
| 2014/0130926 | A1 | 5/2014 | Hoffman et al. |

FOREIGN PATENT DOCUMENTS

| | | |
|---|---|---|
| JP | S62-93939 A | 4/1987 |
| JP | 2001-274142 A | 10/2001 |
| JP | 2002009048 A | 1/2002 |
| JP | 2002064085 A | 2/2002 |
| JP | 2002-530857 A | 9/2002 |
| JP | 2003-092288 A | 3/2003 |
| JP | 2005123582 A | 5/2005 |
| JP | 2005-347619 A | 12/2005 |
| JP | 2006-270054 | 10/2006 |
| JP | 2006270054 A | 10/2006 |

OTHER PUBLICATIONS

The First Office Action for Chinese Patent Application No. 200880012922.7 dated Aug. 24, 2010.
Official Letter dated Jul. 6, 2011, from Chinese Patent Office for corresponding Chinese Patent Application No. 200880012922.7.
Official Letter dated Oct. 25, 2011 from Chinese Patent Office for corresponding Chinese Patent Application No. 200880012922.7.
Official Letter dated Feb. 28, 2013 from Japanese Patent Office for corresponding Japanese Patent Application No. 2010-506496.
Official Letter dated Sep. 9, 2013 from Taiwan Patent Office for corresponding Taiwan Patent Application No. 097115345.
Prosecution history of U.S. Appl. No. 12/109,332 dated Jan. 16, 2014.
Official Letter dated Mar. 6, 2014 from Korean Patent Office for corresponding Korean Patent Application No. 2009-7024312.
Official Letter dated Feb. 4, 2014 from Japanese Patent Office for corresponding Japanese Patent Application No. 2010-506496.
Chinese Office Action dated Jun. 18, 2014 for Application No. 200880012922.7.
Taiwan Office Action dated Jul. 9, 2015 for Application No. 103118275.

* cited by examiner

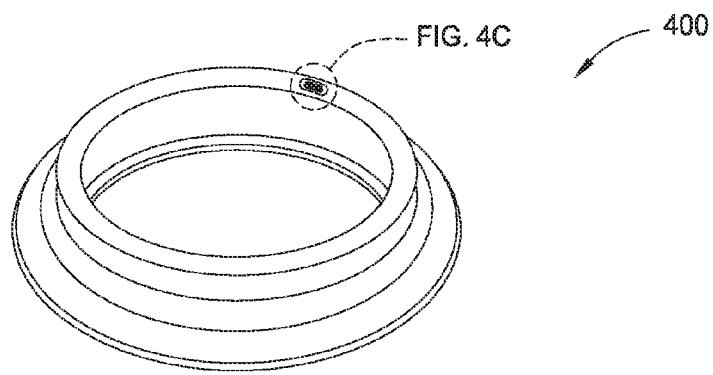
FIG. 4A
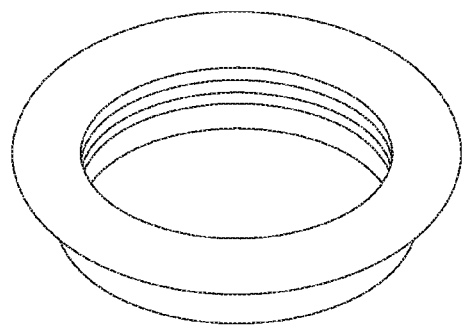
FIG. 4B
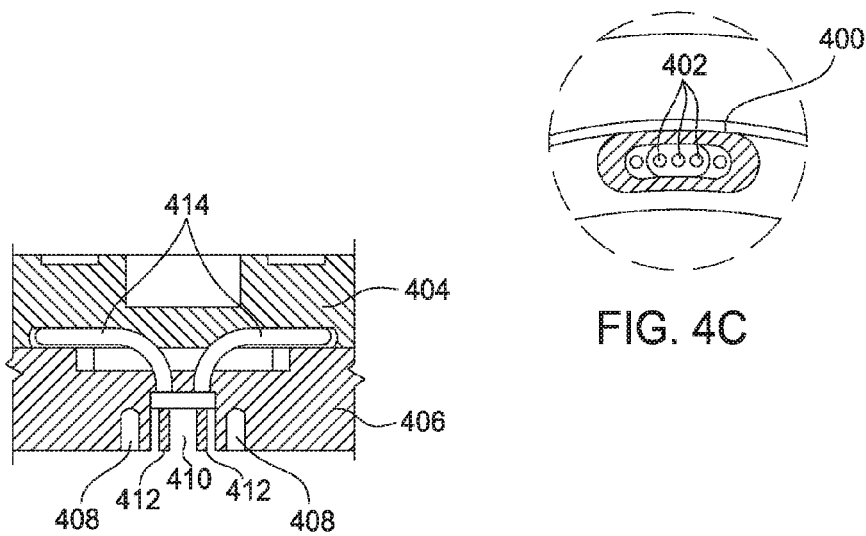
FIG. 4C
FIG. 4D

ANNULAR BAFFLE

CROSS-REFERENCE TO RELATED APPLICATIONS

This application is a continuation of U.S. patent application Ser. No. 14/162,497, filed Jan. 23, 2014, which is a divisional of U.S. patent application Ser. No. 12/109,332, filed on Apr. 24, 2008, which is now U.S. Pat. No. 8,647,438, which claims benefit of U.S. provisional patent application Ser. No. 60/914,583, filed Apr. 27, 2007, all of which applications are incorporated by reference in their entireties.

BACKGROUND OF THE INVENTION

Field of the Invention

Embodiments of the present invention generally relate to a baffle assembly for confining a plasma in an etching chamber.

Description of the Related Art

Plasma processing of semiconductor substrates in the manufacture of microelectronic integrated circuits is used in dielectric etching, metal etching, chemical vapor deposition (CVD) and other processes. In semiconductor substrate processing, the trend towards increasingly smaller feature sizes and line-widths has placed a premium on the ability to mask, etch, and deposit material on a semiconductor substrate, with greater precision.

Etching may be accomplished by applying radio frequency (RF) power to a working gas supplied to a processing region over a substrate supported by a support member. The resulting electric field creates a reaction zone in the processing region that excites the working gas into a plasma. The support member may be biased to attract ions within the plasma towards the substrate supported thereon. Ions migrate towards a boundary layer of the plasma adjacent to the substrate and accelerate upon leaving the boundary layer. The accelerated ions produce the energy required to remove, or etch, the material from the surface of the substrate. As the accelerated ions can etch other components within the processing chamber, confining the plasma to the processing region above the substrate may be beneficial.

Unconfined plasmas may cause etch-byproduct (typically polymer) deposition on the chamber walls and could also etch the chamber walls. Etch-byproduct deposition on the chamber walls could cause the process to drift. The etched materials from the chamber walls could contaminate the substrate by re-deposition and/or could create particles for the chamber. In addition, unconfined plasmas could also cause etch-byproduct deposition in the downstream areas. The accumulated etch-byproduct may flake off and result in particles.

Therefore, there is a need in the art for an improved baffle assembly for confining plasma within a processing region inside the plasma chamber.

SUMMARY OF THE INVENTION

A baffle assembly for an etching apparatus is disclosed. The baffle assembly includes a ring and a lower baffle portion having a curved wall extending between a flange portion and a lower frame portion. A heating assembly may be present within the lower frame portion to control the temperature of the baffle. The baffle assembly may help confine the plasma within the processing space in the chamber. The ring may comprise silicon carbide and the lower baffle portion may comprise aluminum.

In one embodiment, a baffle assembly is disclosed. The baffle assembly may include a ring and a base portion coupled to the ring. The base portion comprises a flange having a first diameter, a lower frame portion having a second diameter less than the first diameter, and a first wall coupled between the flange and the lower frame portion. The first wall curves out from the lower frame portion to the flange.

In another embodiment, a ring for use in a baffle assembly of an etching chamber is disclosed. The ring may include a top wall extending to a first diameter, an outer wall having a second diameter greater than the first diameter, and a second wall coupled between the top wall and the outer wall. The second wall curves from the top wall at the first diameter to the outer wall at the second diameter.

In another embodiment, a base portion of a baffle is disclosed. The base portion may include a flange having a first diameter, a lower frame portion having a second diameter less than the first diameter, and a first wall coupled between the flange and the lower frame portion. The first wall curves out from the lower frame portion to the flange.

In another embodiment, a baffle assembly is disclosed. The baffle assembly may include a ring and a base portion coupled to the ring. The base portion comprises a flange having a first diameter, a lower frame portion having a second diameter less than the first diameter, a supporting portion for supporting the flange, and a heating assembly.

In another embodiment, a base portion of a baffle is disclosed. The base portion may include a flange having a first diameter, a lower frame portion having a second diameter less than the first diameter, a supporting portion for supporting the flange, and a heating assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A and 4B are schematic perspective views of a lower baffle portion according to one embodiment of the invention.

FIG. 4C is a cross-sectional view of cut out C from FIG. 4A.

FIG. 4D is a cross-sectional view of FIG. 4C.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention comprises a baffle assembly for confining a plasma to a processing region in a plasma processing apparatus. While the invention will be described below in relation to an ENABLER® etching system available from Applied Materials, Inc., Santa Clara, Calif., it is to be understood that the invention may be used in other processing chambers including physical vapor deposition (PVD) chambers, CVD chambers, etc., including those chambers sold by other manufacturers.

Figure 1:
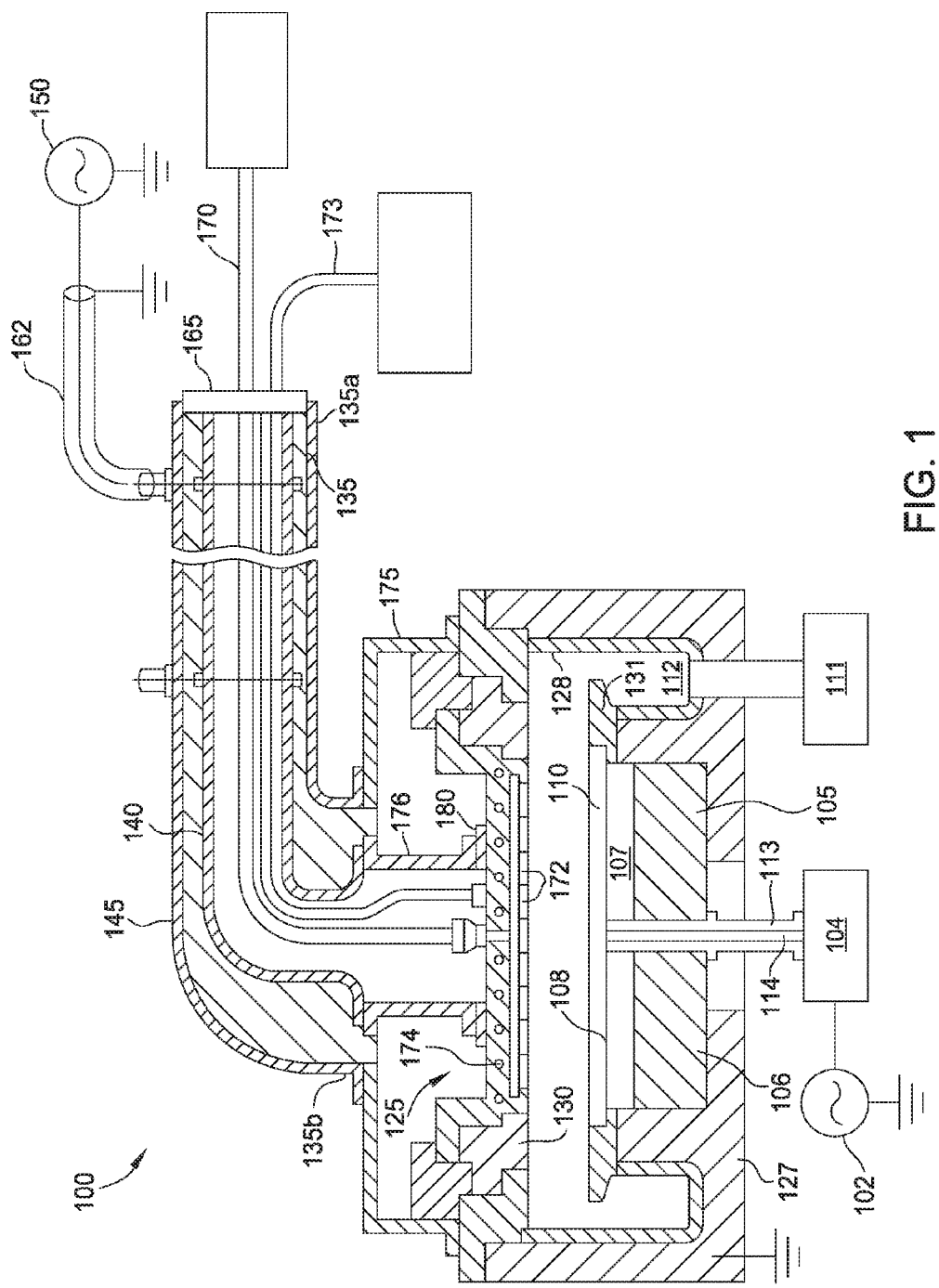
FIG. 1 is a schematic view of a plasma processing chamber according to one embodiment of the invention.

FIG. 1 illustrates an example of a plasma reactor, such as the ENABLER® etching system manufactured by Applied Materials, Inc., of Santa Clara, Calif., that includes a reactor chamber 100, which may include liners to protect the walls, with a substrate support (or pedestal) 105 at the bottom of the chamber 100 supporting a semiconductor substrate. The chamber 100 is bounded at the top by a disc shaped overhead aluminum electrode 125 supported at a predetermined gap length above the substrate on grounded chamber body 127 by a dielectric (quartz) seal 130. A power generator 150 applies very high frequency (VHF) power to the electrode 125. VHF is typically between about 30 MHz to about 300 MHz and is one of the RF bands, which range from about 10 kHz to about 10 GHz. In one embodiment, the VHF source power frequency is 162 MHz for a 300 mm substrate diameter. VHF power from the generator 150 is coupled through a coaxial cable 162 matched to the generator 150 and into a coaxial stub 135 connected to the electrode 125. The stub 135 has a characteristic impedance and resonance frequency, and provides an impedance match between the electrode 125 and the coaxial cable 162 or the VHF power generator 150. The chamber body is connected to the VHF return (VHF ground) of the VHF generator 150.

Bias power is applied to the substrate by a bias power RF signal generator 102 coupled through a conventional impedance match circuit 104 to the substrate support 105. The power level of the bias generator 102 controls the ion energy near the substrate surface. The bias power (typically at 13.56 MHz) is typically used to control ion energy, while the VHF source power is applied to the overhead electrode to govern plasma density.

A vacuum pump system 111 evacuates the chamber 100 through a plenum 112. The substrate support 105 includes a metal pedestal layer 106 supporting a lower insulation layer 107, an electrically conductive mesh layer 108 overlying the lower insulation layer 107 and a thin top insulation layer 110 covering the conductive mesh layer 108. The semiconductor workpiece or substrate is placed on top of the top insulation layer 110. The substrate support 105 and the substrate form a cathode during substrate processing. If the substrate is not present, the substrate support 105 is the cathode during plasma processing. The electrically conductive mesh layer 108 and the metal pedestal layer 106 may be formed of materials such as molybdenum and aluminum respectively. The insulation layers 107 and 110 may be formed of materials such as aluminum nitride or alumina. The conductive mesh layer 108 supplies the RF bias voltage to control ion bombardment energy at the surface of the substrate. The conductive mesh 108 also can be used for electrostatically chucking and de-chucking the substrate, and in such a case can be connected to a chucking voltage source in the well-known fashion. The conductive mesh 108 therefore is not necessarily grounded and can have, alternately, a floating electric potential or a fixed D.C. potential in accordance with conventional chucking and de-chucking operations. The substrate support 105, in particular the metal pedestal layer 106, typically (but not necessarily) is connected to ground, and forms part of a return path for VHF power radiated by the overhead electrode 125.

In order to improve the uniformity of impedance across the substrate support, a dielectric cylindrical sleeve 113 is designed to surround the RF conductor 114. The axial length and the dielectric constant of the material constituting the sleeve 113 determine the feed point impedance presented by the RF conductor 114 to the VHF power. By adjusting the axial length and the dielectric constant of the material constituting the sleeve 113, a more uniform radial distribution of impedance can be attained, for more uniform capacitive coupling of VHF source power.

A terminating conductor 165 at the far end 135a of the stub 135 shorts the inner and outer conductors 140, 145 together, so that the stub 135 is shorted at its far end 135a. At the near end 135b (the unshorted end) of the stub 135, the outer conductor 145 is connected to the chamber body via an annular conductive housing or support 175, while the inner conductor 140 is connected to the center of electrode 125 via a conductive cylinder 176. A dielectric ring 180 is held between and separates the conductive cylinder 176 and the electrode 125.

The inner conductor 140 can provide a conduit for utilities such as process gases and coolant. The principal advantage of this feature is that, unlike typical plasma reactors, the gas line 170 and the coolant line 173 do not cross large electrical potential differences. They therefore may be constructed of metal, a less expensive and more reliable material for such a purpose. The metallic gas line 170 feeds gas inlets 172 in or adjacent the overhead electrode 125 while the metallic coolant line 173 feeds coolant passages or jackets 174 within the overhead electrode 125.

Since plasma density is relatively low near the wall, a baffle assembly 131 placed around the substrate with a distance (or gap) from the inner chamber wall 128 may confine the plasma. The distance (or gap) between the edge of the baffle assembly 131 and the inner chamber wall 128 cannot be too large. If the gap distance is larger than the plasma sheath thickness near the chamber wall, it could increase the amount of plasma being drawn away from the reaction zone above the substrate and toward the chamber wall and downstream, which makes the plasma less confined. The distance (or gap) between the edge of the baffle assembly 131 and the inner chamber wall 128 cannot be too small either, since the flow resistance, which affects the chamber pressure, would increase to an unacceptable level. Therefore, the baffle assembly 131 is placed around the substrate with a suitable distance from the inner chamber wall 128 to provide good plasma confinement and low flow resistance.

Figure 2A:
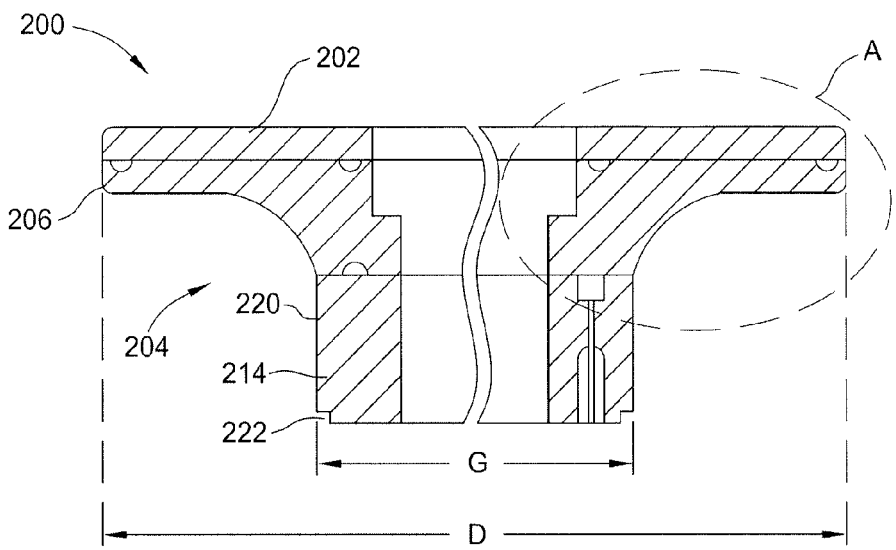
FIG. 2A is a cross-sectional view of a baffle assembly according to one embodiment of the invention.

FIG. 2A is a cross-sectional view of a baffle assembly 200 according to one embodiment of the invention. The baffle assembly 200 comprises a ring 202 and a base portion 204. The base portion 204 also comprises a flange 206 having a first diameter "D" of between about 19 inches and about 20 inches. A curved wall 208 extends from the flange 206 to a heating assembly 214 that is coupled with the base portion 204. The curved wall 208 provides support for the flange 206 extending from the base portion 204 as well as the ring 202. The innermost outer wall 220 of the base portion 204 has a diameter "G" of between about 14 inches and about 16 inches. A notch 222 may also be present on the bottom of the base portion 204. A heating assembly may be present in the baffle assembly 200. The heating assembly may comprise a heating tube brazed inside the base potion 204.

Figure 2B:
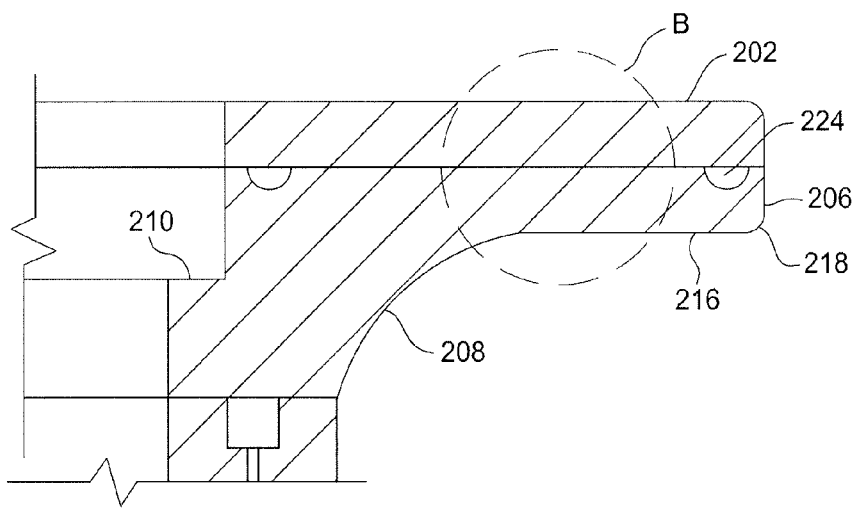
FIG. 2B is a cross-sectional view of cut out A from FIG. 2A.

FIG. 2B is a cross-sectional view of cut out A from FIG. 2A. A ledge 210 may be disposed radially inward of the flange 206. A curved wall 218 may extend between the outer wall 218 of the flange 206 and a bottom wall 216 of the flange 206.

Figure 2C:
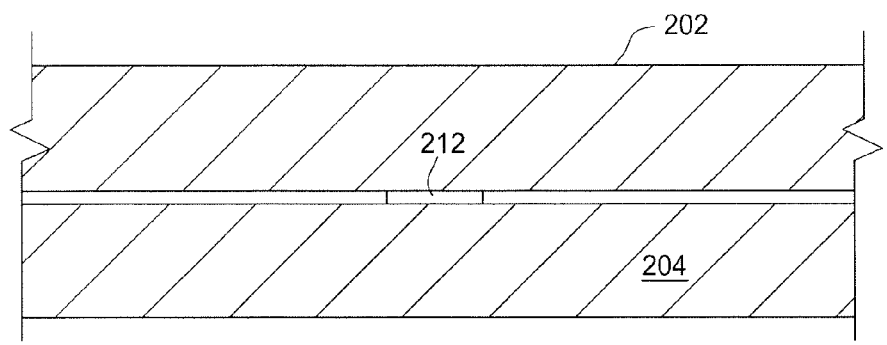
FIG. 2C is a cross-sectional view of cut out B from FIG. 2B.

FIG. 2C is a cross-sectional view of cut out B from FIG. 2B. The ring 202 may be bonded to the base portion 204 with one or more spacers 212 disposed therebetween. One or more O-rings 224 may also be disposed between the base portion 204 and the ring 202 to provide a bonded seal between the ring 202 and the base portion 204. The O-rings 224 may be disposed within a notch formed in the base portion 204.

Figure 3A:
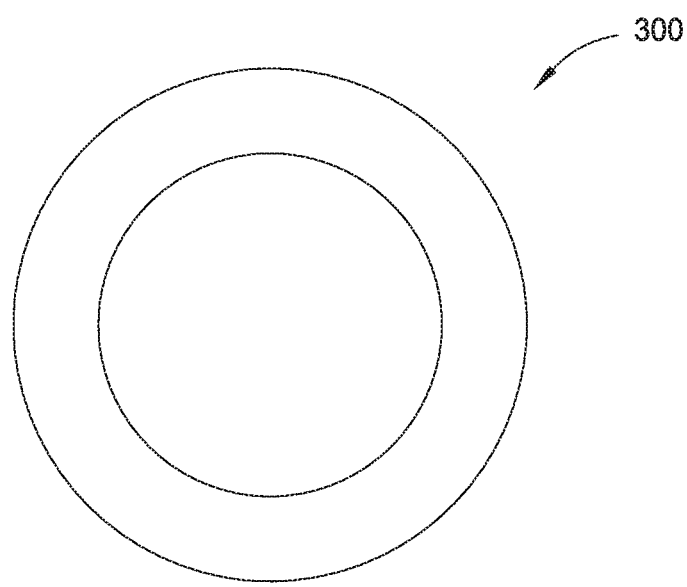
FIG. 3A is a top view of a ring according to one embodiment of the invention.
Figure 3B:
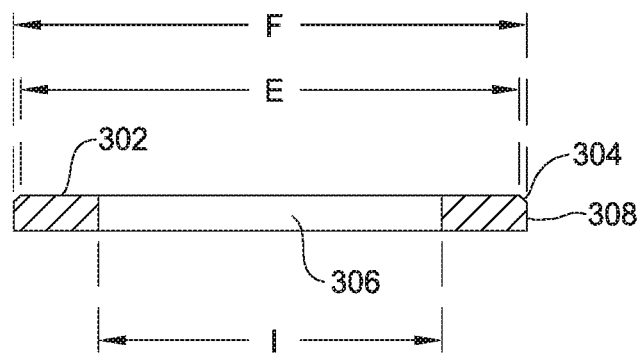
FIG. 3B is a cross-sectional view of a ring of FIG. 3A.

FIG. 3A is a top view of a ring 300 according to one embodiment of the invention. FIG. 3B is a cross-sectional view of the ring 300 of FIG. 3A. The ring 300 may comprise a top wall 302 having a diameter "E" between about 18 inches and about 19 inches. The ring 300 may also comprise an outer wall 308 having a diameter "F" between about 19 inches and about 20 inches. A curved wall 304 may extend between the outer wall 308 and the top wall 302. The ring 300 may comprise an opening 306 having a diameter "I" between about 13 inches and about 14 inches. In one embodiment, the diameter of the outer wall 308 of the ring may be substantially equal to the diameter of the flange 206.

FIGS. 4A and 4B are schematic perspective views of a lower baffle portion according to one embodiment of the invention. FIG. 4A is a schematic perspective view of the lower baffle portion viewed from the bottom. FIG. 4B is a schematic view of the lower baffle portion viewed from the top. As may be seen in FIG. 4A, the bottom of the lower baffle portion has a female receptacle for providing power to the heating assembly. FIG. 4C is a cross sectional view of cut out C from FIG. 4A showing the female receptacle 400. As may be seen from FIG. 4C, the receptacle comprises three slots 402 for receiving a power plug.

FIG. 4D is a cross-sectional view of FIG. 4C. FIG. 4D shows a cross sectional view of the female receptacle 400 shown in FIG. 4C. The lower baffle portion comprises a top portion 404 coupled with a bottom portion 406. Fastening mechanisms 408 may be used to secure the female receptacle to the bottom portion 406. In one embodiment, the fastening mechanism 408 is a screw, but it is to be understood that other fastening mechanisms 408 may be utilized. Two electrical contacts 412 are disposed in the receptacle 410 to deliver the electrical power to the heating tubes 414 that are brazed within the lower baffle portion.

Figure 5:
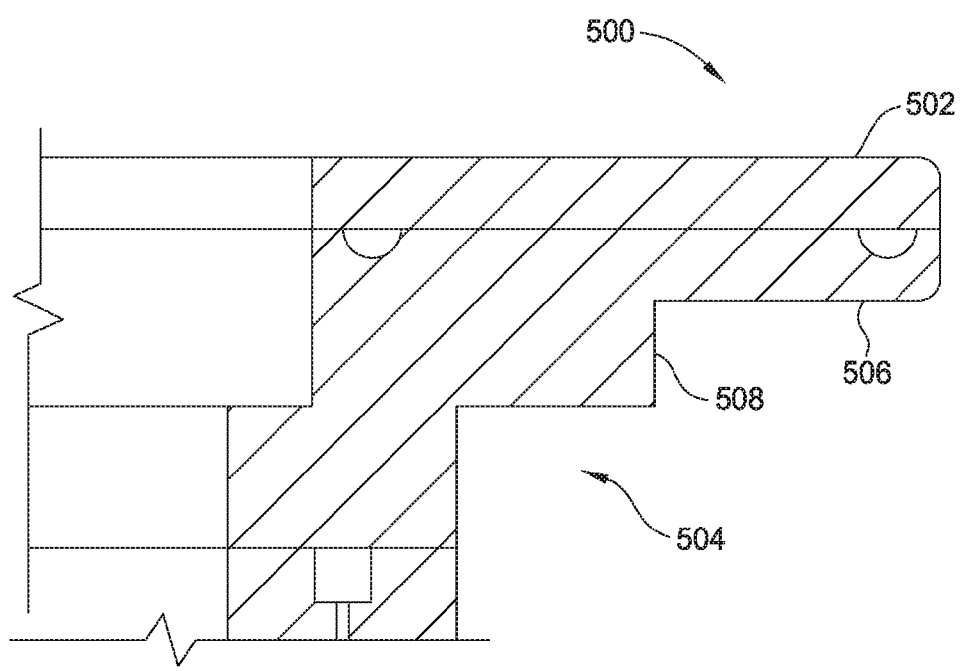
FIG. 5 shows a baffle assembly according to another embodiment of the invention.

FIG. 5 shows a baffle assembly 500 according to another embodiment of the invention. As may be seen in FIG. 5, the baffle assembly 500 comprises a ring 502 coupled with a lower portion 504 having a flange 506 supported by a support structure 508. In one embodiment, the support structure 508 may comprise a step or corner shape. While a step or corner shape is shown as the support structure 508, it is to be understood that other shapes may be utilized to provide mechanical strength to support the flange 506, including curved walls as discussed above.

While the foregoing is directed to embodiments of the present invention, other and further embodiments of the invention may be devised without departing from the basic scope thereof, and the scope thereof is determined by the claims that follow.

The invention claimed is:
1. A baffle assembly, comprising:
   a ring;
   a base portion coupled to the ring, the base portion having an opening formed axially therethrough, the base portion comprising:
      a flange having a first diameter;
      a ledge formed on a surface of the opening;
      a lower frame portion having a second diameter less than the first diameter; and
      a supporting portion for supporting the flange;
   one or more spacers located between and in contact with the ring and the base portion; and
   a heating assembly coupled to a lower surface of the base portion.
2. The assembly of claim 1, wherein the ring comprises silicon and wherein the base portion comprises aluminum.
3. The assembly of claim 1, wherein the supporting portion comprises a stepped surface.
4. The assembly of claim 1, wherein the opening formed axially through the base portion has a first inner diameter above the ledge, and a second inner diameter first diameter below the ledge, wherein the second inner diameter less than the first inner diameter.
5. The assembly of claim 4, wherein the ring comprises a central opening formed therethrough, the central opening having a diameter equal to the first inner diameter of the axial opening through the base portion.
6. The assembly of claim 1, further comprising a heating tube brazed inside the heating assembly.
7. The assembly of claim 1, further comprising one or more o-rings positioned at the interface of the ring and the base portion.
8. The assembly of claim 1, wherein the supporting portion comprises a stepped surface, wherein a lower edge of the stepped surface is coplanar with an outer surface of heating assembly.
9. The assembly of claim 1, wherein the supporting portion is a curved wall.
10. The assembly of claim 9, wherein the opening formed axially through the base portion has a first inner diameter above the ledge, and a second inner diameter below the ledge, wherein the second inner diameter less than the first inner diameter.
11. The assembly of claim 10, wherein the ring has a central opening formed therethrough, the central opening having a diameter equal to the first inner diameter of the axial opening through the base portion.
12. The assembly of claim 11, further comprising a heating tube brazed inside the heating assembly.
13. A baffle assembly, comprising:
   a ring;
   a base portion coupled to the ring, the base portion having an opening formed axially therethrough, the base portion comprising:
      a flange having a first diameter;
      a ledge formed on a surface of the opening;
      a lower frame portion having a second diameter less than the first diameter; and
      a supporting portion for supporting the flange, the supporting portion comprising a curved wall;
   one or more spacers located between and in contact with the ring and the base portion; and
   a heating assembly having a heating tube brazed therein, the heating assembly coupled to a lower surface of the base portion.
14. The assembly of claim 13, wherein the opening formed axially through the base portion has a first inner diameter above the ledge, and a second inner diameter below the ledge, wherein the second inner diameter less than the first inner diameter.

16. The assembly of claim 14, further comprising one or more spacers located between and in contact with the ring and the base portion.

16. The assembly of claim 15, wherein the ring has a central opening formed therethrough, the central opening having a diameter equal to the first inner diameter of the axial opening through the base portion.

17. A baffle assembly, comprising:
   a ring;
   a base portion coupled to the ring, the base portion having an opening formed axially therethrough, the base portion comprising:
      a flange having a first diameter;
      a ledge formed on a surface of the opening;
      a lower frame portion having a second diameter less than the first diameter; and
      a supporting portion for supporting the flange, the supporting portion comprising a stepped surface;
   one or more spacers located between and in contact with the ring and the base portion; and
   a heating assembly having a heating tube brazed therein, the heating assembly coupled to a lower surface of the base portion.

* * * * *